United States Patent [19]

Holmberg et al.

[11] Patent Number: 5,668,032
[45] Date of Patent: Sep. 16, 1997

[54] ACTIVE MATRIX ESD PROTECTION AND TESTING SCHEME

[76] Inventors: Scott H. Holmberg, 9921 Longview La., Pleasanton, Calif. 94588; Quy Vu, 46710 Crawford St., #32, Fremont, Calif. 94539

[21] Appl. No.: 497,372

[22] Filed: Jul. 31, 1995

[51] Int. Cl.$^6$ .................. H01L 21/786; G02F 1/1343
[52] U.S. Cl. .................. 438/144; 349/40; 257/59; 458/6
[58] Field of Search .................. 437/51, 47, 8, 437/918, 181; 148/DIG. 136; 349/40, 49, 54, 139, 145, 146, 148; 247/59, 72

[56] References Cited

U.S. PATENT DOCUMENTS

| | | | |
|---|---|---|---|
| 4,820,222 | 4/1989 | Holmberg et al. | 437/8 |
| 5,019,001 | 5/1991 | Abe et al. | 437/8 |
| 5,019,002 | 5/1991 | Holmberg | 437/56 |
| 5,068,748 | 11/1991 | Ukai et al. | 349/40 |
| 5,123,847 | 6/1992 | Holmberg et al. | 437/181 |
| 5,497,146 | 3/1996 | Hebiguchi | 257/59 |

FOREIGN PATENT DOCUMENTS

| | | |
|---|---|---|
| 2190820 | 7/1990 | Japan . |
| 3134628 | 6/1991 | Japan . |

*Primary Examiner*—Michael Trinh
*Attorney, Agent, or Firm*—Ruden, McClosky, Smith, Schuster & Russell, PA

[57] ABSTRACT

An improved method of manufacturing active matrix displays with ESD protection through final assembly and in process testing and repair capabilities. At least a first set of shorting bars is formed adjacent the row and column matrix. The shorting bars are respectively coupled to one another in series to allow testing of the matrix elements. A first shorting bar is coupled to the odd row lines, a second shorting bar is coupled to the even row lines, a third shorting bar is coupled to the odd column lines and a fourth shorting bar is coupled to the even column lines. The shorting bars can remain coupled to the matrix through final assembly to provide ESD protection and final assembly and testing capability.

16 Claims, 5 Drawing Sheets

ACTIVE MATRIX ESD PROTECTION AND TESTING SCHEME

BACKGROUND OF THE INVENTION

The present invention pertains to an improved active matrix display and method of making the displays. More particularly, the present invention is directed to a method of making displays including providing ESD protection, testing and repair to increase the yield of the finished displays.

In recent years there has been growing interest in thin film transistors and devices incorporating such thin film transistors, such as memory arrays, all types of integrated circuits and replacements for mechanical switches and relays. For example, reed relays can fatigue and MOS switches exhibit too much leakage current.

A specific exemplary use of the thin film transistor is in flat panel displays, such as those which employ liquid crystals, field emission, plasma, electrochromic or electroluminescense, as replacements for conventional cathode ray tubes (CRT). The flat panel displays promise lighter weight, less bulk and substantially lower power consumption than CRT's. Also, as consequence of their mode of operation, CRT's nearly always suffer from some distortion. The CRT functions by projecting an electron beam onto a phosphor-coated screen. The beam will cause the spot on which it is focused to glow with an intensity proportional to the intensity of the beam. The display is created by the constantly moving beam causing different spots on the screen to glow with different intensities. Because the electron beam travels a further distance from its stationary source to the edge of the screen that it does to the middle, the beam strikes various points on the screen at different angles with resulting variation in spot size and shape (i.e. distortion).

Flat panel displays are inherently free of such distortion, because each pixel is photolithographically patterned on the substrate as opposed to being defined by where the CRT electron beam strikes the phosphor on the screen. In the manufacture of the flat panel displays the circuit elements are deposited and patterned, generally by photolithography, on a substrate, such as glass. The elements are deposited and etched in stages to build a device having a matrix of perpendicular rows and columns of circuit control lines with a pixel contact and control element between the control line rows and columns. The pixel contact has a medium thereon which is a substance that either glows (emissive) or modulates the transmission of ambient light (nonemissive) when a threshold voltage is applied across the medium control element. The medium can be a liquid crystal, electroluminescent or electrochromic materials such as zinc sulfide, a gas plasma of, for example, neon and argon, a dichroic dye, or such other appropriate material or device as will luminesce or otherwise change optical properties in response to the application of voltage thereto. Light is generated or other optical changes occur in the medium in response to the proper voltage applied thereto. The optically active medium on each contact is generally referred to as a picture element or "pixel".

The circuitry for a flat panel display is generally designed such that data is generally shifted in on all the column lines each to a predetermined voltage. One row is then energized to turn on all the transistors in that row (one row is written at a time). That row is then shut off and the data for the next row is shifted into all the column lines and then the second row is energized and written. This process is repeated until all the rows have been addressed. All the rows are generally written in one frame period, typically about 1/60th of a second or about 16.7 ms. Then voltages representing the data are supplied selectively to particular columns to cause selected pixels to light up or change optical properties as the row is written. The pixels can be made to change intensity by applying a large voltage or current or a longer pulse of voltage or current. Utilizing liquid crystal displays (LCD's) with twisted nematic active material, the display is substantially transparent when not activated and becomes light absorbing when activated or vice versa depending upon polarizer orientation. Thus, the image is created on the display by sequentially activating the pixels, row by row across the display. The geometric distortion described above with respect to CRT's is not a factor in flat panel displays since each pixel location is photolithographically determined and fixed.

One of the major problems that arises with respect to the prior art method of manufacturing structures for active matrix displays (e.g., those employing thin film transistors at each pixel) is that they generally suffer production yield problems similar to those of integrated circuits. That is, the yields of devices produced are generally not 100% and the yield (percentage of devices with no defects) can be 0% in a worst case. High quality displays will tolerate very few defective transistors or other components. Also, larger size displays are generally more desirable than smaller size displays. Thus, a manufacturer is faced with the dilemma of preferring to manufacture larger size and/or higher resolution displays, but having to discard the entire product if more than a few transistors and hence if more than a few pixels are defective. In other words, the manufacturer suffers a radically increased manufacturing cost per unit resulting from decreasing usable product yield.

One problem encountered with making displays is that the plurality of lines and transistors can build up static charges during manufacturing which can damage or destroy the device elements. Prevention of ESD problems will increase the product yield.

Another product yield enhancement can be obtained by testing for and repairing defects in the elements during the display manufacturing steps. One prior art testing technique is to physically probe all the lines individually.

These problems of increased cost and decreased yield are dramatically improved in the present invention by providing a method of manufacturing active matrix displays with a greatly reduced number of defects.

SUMMARY OF THE INVENTION

There is provided an improved method of making active matrix displays to eliminate defects in the completed displays. A plurality of shorting bars are provided and interconnected to one another and to all of the row and column lines to provide ESD protection. To allow testing of the row and column lines, a first shorting bar is coupled to all the even row lines and a second shorting bar is coupled to all the odd row lines to allow separate driving and testing of the even and odd rows. A third shorting bar is coupled to all the even column lines and a fourth shorting bar is coupled to all the odd column lines to also allow separate driving and testing of the even and odd columns. All four shorting bars are connected in series by resistors having a magnitude on the order of one hundred times the resistance of each shorting bar forming a first set of shorting bars. A second set of shorting bars can be provided coupled in parallel to the first set of shorting bars. One set of shorting bars can be left connected when the backplane is assembled with the TFT substrate to provide ESD protection for further testing options and assembly.

DESCRIPTION OF THE PREFERRED EMBODIMENTS

Figure 1:
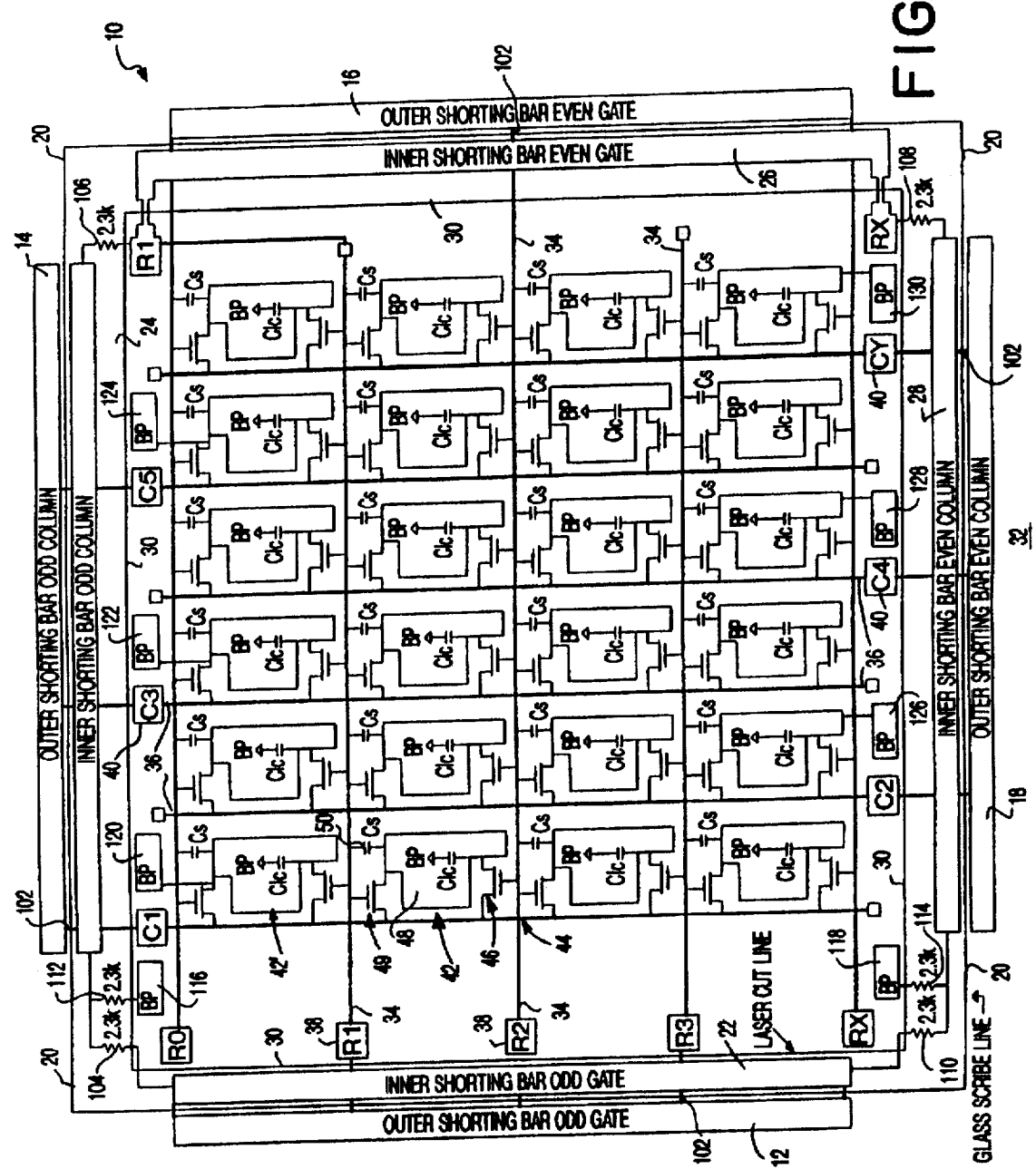
FIG. 1 is a plan view schematic representation of an active matrix display incorporating the ESD and testing technique of the present invention.

As before mentioned, numerous devices can be formed utilizing thin film transistors (TFT's), one particular utilization is in active matrix liquid crystal displays (AMLCD's) and the TFT of the present invention will be described as a portion of an AMLCD. Referring to FIG. 1, a schematic representation of an AMLCD of the present invention is designated generally by the reference numeral 10.

The AMLCD 10 is illustrated including a set of optional outer shorting bars 12, 14, 16 and 18. The outer shorting bars 12, 14, 16 and 18 are removed during processing by disconnecting or breaking them away along a scribe line 20, as more fully described hereinafter.

The AMLCD 10 also is illustrated including a set of inner shorter bars 22, 24, 26 and 28. The inner shorting bars 22, 24, 26, and 28 also are utilized during processing, as more fully described hereinafter. However, the inner shorting bars 22, 24, 26 and 28 only are electronically disconnected from the AMLCD 10 along a line 30 such as by a laser, but remain a physical part of the AMLCD 10.

The AMLCD 10 is deposited on a substrate 32, commonly formed from a glass panel, which is broken away along the scribe line 20 as above described. The substrate 32 also can be formed from other types of insulating materials, including for non-light transmissive applications a metallic panel with an insulative coating. The AMLCD 10 is formed with a plurality of row lines 34 and a plurality of column lines 36 forming a large matrix, only a small portion of which is illustrated. The row lines 34 include one of a plurality of driver contact pads 38 connected to each line 34 and the column lines 36 also include one of a plurality of driver contact pads 40 connected to each line 36.

The AMLCD 10 includes a plurality of identical pixels formed between the row lines 34 and the column lines 36, therefore only one pixel 42 will be described in detail. At each matrix crossover point 44, where a row line 34 and a column line 36 cross, a TFT 46 is formed to connect both lines to a pixel contact 48. The active liquid crystal medium is formed at least over the contact 48, which medium will change properties in response to the backplane and data voltages applied to the pixel 42. The medium on the pixel 42 will appear generally as a square, rectangle or dot in the overall matrix of the AMLCD 10. The actual size of the transistor 46 and the contact 48 are not drawn to scale, but are shown schematically for illustration only.

It should be noted that there is no theoretical limit on the number of row lines 34 and column lines 36 that can be employed or on the outside dimension of an AMLCD 10. The processing equipment provides a practical limit on the outside dimension, which limit is continually changing as the equipment is improved.

The problem encountered with manufacturing AMLCD's is that if the AMLCD 10 contains defective TFT's or other circuit elements causing more than a few pixels to be inoperative, the display generally must be discarded. One technique of masking defective pixels 42, is to employ an additional (optional) transistor 49 with the pixel 42 coupling the pixel 42 to an adjacent row R1. Then, when row R1 is written the data is applied not only to the previous pixel 42', but also through the transistor 49 into the pixel 42. When row R2 then is written the data for the pixel 42 is written over the data from the previous pixel through the transistor 46. If, however, the transistor 46 is defective, the pixel 42 will not show as inoperative, but instead will retain the data from the previous row R1. This masks the fact that the pixel 42 is not operating correctly. The pixel 42 also can include a storage capacitor 50 coupled to the row R1 which maintains and stabilizes the voltage written into the pixel 42 during each frame.

Figure 2:
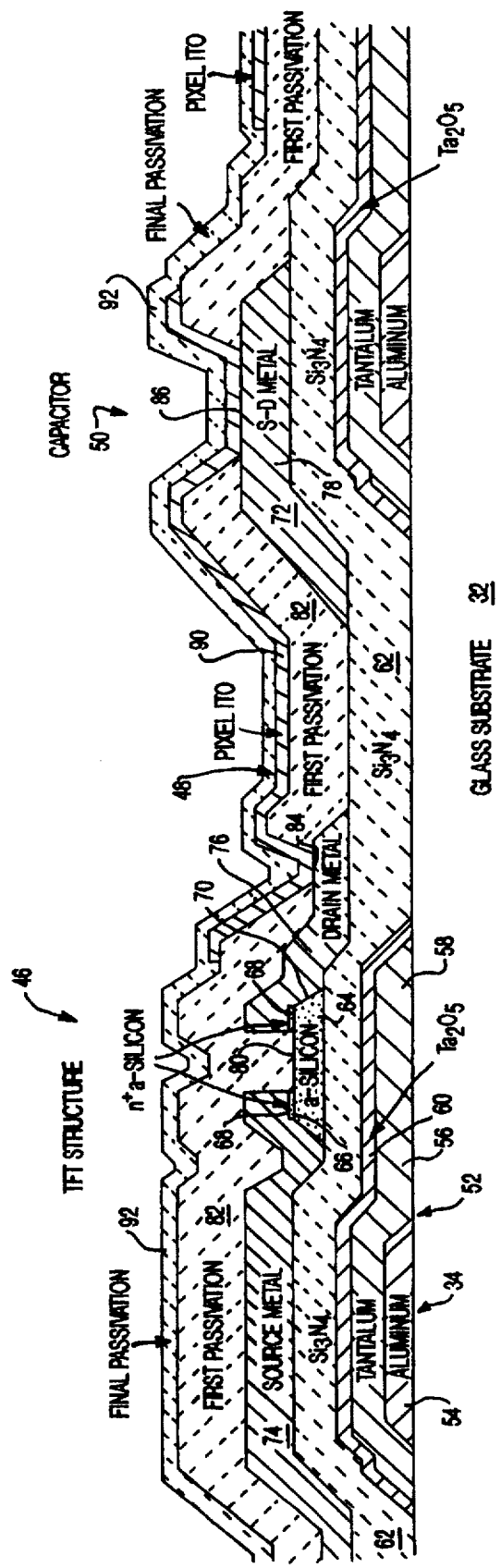
FIG. 2 is a staggered cross-section of one embodiment of a transistor and a storage capacitor which can be utilized in the displays of the present invention.
Figure 3:
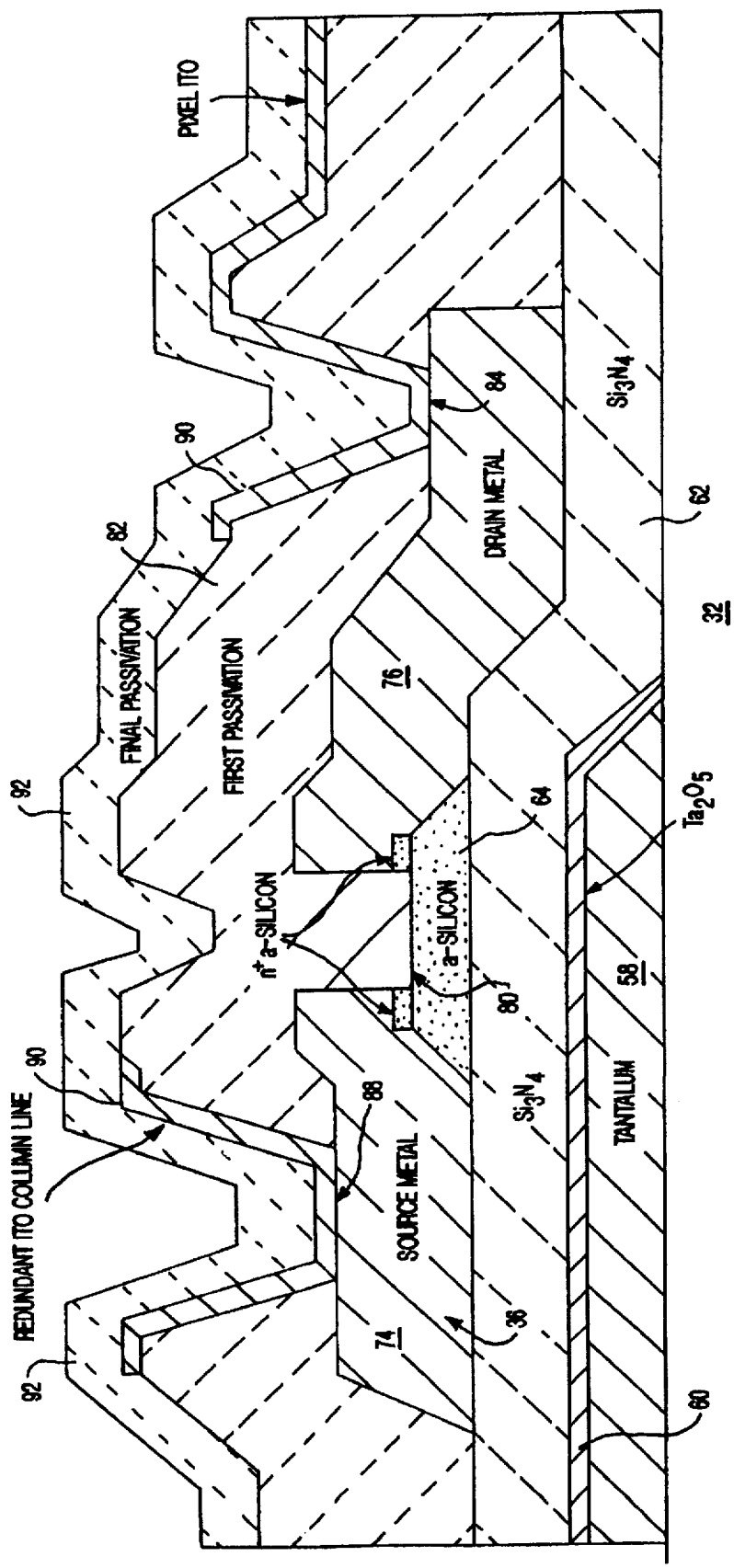
FIG. 3 is a second cross-section of the transistor embodiment of FIG. 2.

The TFT 46 and the AMLCD 10 of the present invention are formed to enhance the yield of active pixels. The TFT 46 will be described with reference to FIG. 2. The TFT 46 is formed with a gate 52 being deposited first as the row line 34. The completed TFT 46 is illustrated in FIGS. 2 and 3, while the various process steps are more fully described in pending application, U.S. Ser. No. 08/497,371, entitled IMPROVED TFT, METHOD OF MAKING AND MATRIX DISPLAYS INCORPORATING THE TFT, filed on Jul. 31, 1995 and incorporated herein by reference. Although the various layer thicknesses are not critical to the invention, preferable thicknesses and materials are described to form a preferred embodiment of the TFT 46 and the AMLCD 10.

The gate 52 preferably is formed of two layers of metal. A first layer of aluminum, preferably an aluminum alloy, is deposited and patterned to form a line element 54. To form a redundant row line 34, a second gate layer of tantalum is deposited over the aluminum element 54 and patterned to form a line element 56 which covers the element 54. The element 56 also has fingers 58 which form the actual gates for the individual TFT's 46. The line element 54 preferably is formed from aluminum or an aluminum alloy. Aluminum is utilized for long lines because of its high conductivity, but is not critical for small displays and can be eliminated from small displays if desired. The aluminum is deposited to about 1200 Angstroms to provide conductivity, but still be thin enough to prevent step coverage problems over the element 54. The tantalum element 56 or other anodic refractory metal preferably is deposited separately for redundancy to about 2000 Angstroms. The fingers 58 which form the gates for the TFT 46 do not require the aluminum layer and typically are formed only of tantalum.

A first gate insulator layer 60 is then formed by anodizing the exposed tantalum element 56, which is hard anodized to form the insulator layer 60 from tantalum oxide, $Ta_2O_5$. A hard anodization can be performed by utilizing a solution of about 0.1 to 4.0 percent citric acid in deionized water. A voltage of about sixty (60) volts can be utilized which will form a very precise and uniform oxide layer 60 to about fifteen (15) Angstroms per volt or about a thickness of 900 Angstroms. The pads 38 and 40 can be covered with photoresist to prevent anodization of the pads or can be anodized and then later etched.

Alternatively, the first gate insulator 60 can be formed by a deposited dielectric layer. A second or redundant gate insulator 62 then is deposited, preferably silicon nitride, Si₃N₄, to a thickness of about 3000 Angstroms. Two additional layers sequentially are deposited, a layer of amorphous silicon 64 and then a layer of N+ doped amorphous silicon 66. The N+ layer 66 and amorphous silicon layer 64 selectively are etched to leave discrete areas 70 over the gate portions 58 on the nitride layer 62. The amorphous silicon layer 64 is deposited to a thickness of about 1500 Angstroms and the N+ layer 66 is deposited to a thickness of about 300 Angstroms. After patterning, the remaining N+ layer forms ohmic contact portions 68.

A reanodization can be performed before the next metal layer is deposited to prevent potential shorts, especially at any point that the drain or source metal overlies the gate metal. The reanodization is performed at a voltage at least twice the maximum voltage normally present between the source and gate lines. The reanodization will form a new oxide in the tantalum or underlying aluminum layer to prevent a later deposited metal from shorting to the gate line through a pinhole which exposed the gate metal.

A source-drain (S-D) layer 72 then is deposited, preferably formed from a plurality of metal layers for large displays. For small displays, the layer 72 can be a single metal layer, such as aluminum or molybdenum. A preferable large device multi-layer 72 is formed by depositing a first barrier layer of molybdenum to a thickness on the order of 500 Angstroms. A second conductivity enhancing layer of aluminum or aluminum alloy then is deposited to a thickness of about 5000 Angstroms. A third barrier layer of molybdenum or molybdenum alloy then is deposited to a thickness of about 300 Angstroms. Alternatively, only the first two layers are required to be deposited.

The S-D layer 72 then is patterned to form a source portion 74, a drain portion 76 and a top capacitor contact portion 78. A transistor channel region 80 then is formed between the source and drain portions 74 and 76 by removing the N+ doped layer between the contact portions 68; which remain under the S-D metal portions 74 and 76. At this point the transistor 46 is electrically functional.

The storage capacitor 50 also now is electrically functional and is formed by the contact portion 78 and the underlying portions of the nitride layer 62, the oxide layer 60 and the gate 52. Both the transistor 46 and the capacitor 50 can now be electrically tested, as desired.

A first passivation layer 82 then is deposited, preferably formed of Si₃N₄ to a thickness of about 7000 Angstroms. This dielectric layer also could be formed from deposited SiO₂, spin on glass (SOG) or other organic dielectric materials. The layer 82 is patterned to form a drain contact opening 84 and a capacitor contact opening 86. When a redundant column line is to be formed, vias 88 (FIG. 3) are formed to provide contacts to the underlying column line 36.

A pixel ITO layer 90 then is deposited and patterned to form the drain contact at the opening 84, the capacitor contact at the opening 86, the redundant column line by contacting through the vias 88 (where applicable) and the pixel 48. The pixel 48 is not shown to scale and the section is offset to include both the transistor 46 and the capacitor structure 50, which are staggered from one another. The section does not fully illustrate the electrical separation between the column ITO and the pixel ITO 48. The additional transistor 49 (FIG. 1) is not illustrated, but is formed in the same manner as the transistor structure 46.

The TFT structure is then completed by forming a final passivation layer 92. The passivation layer 92 is formed to a thickness of about 2000–3000 Angstroms in the same manner as the layer 82. The layer 92 could also be formed on the color filter, substrate or can be formed on both.

Figure 4:
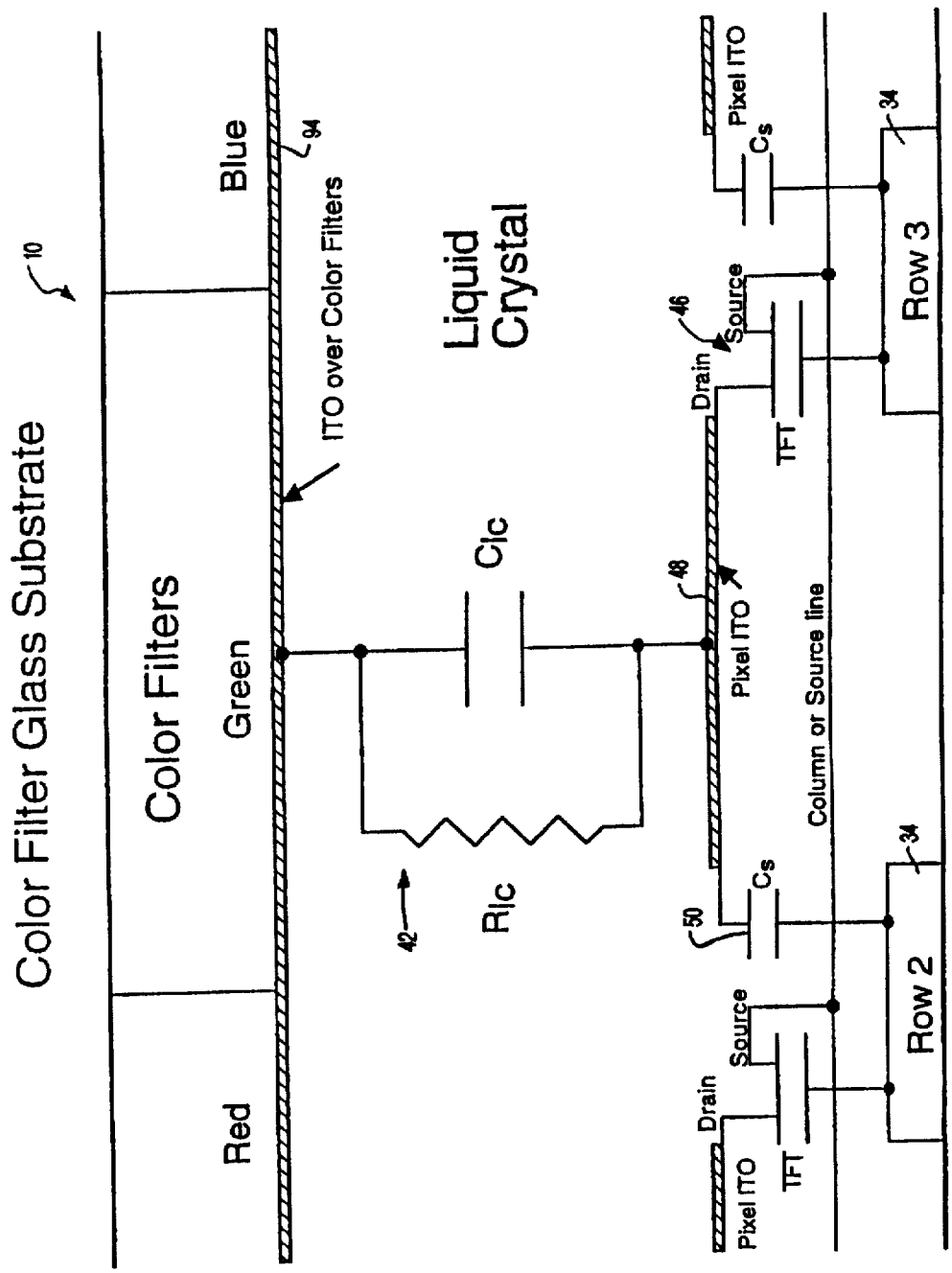
FIG. 4 is a partial diagrammatic view of the completed display.

FIG. 4 illustrates a portion of the completed AMLCD 10 and the reason for utilizing the storage capacitor 50. The capacitor 50 stabilizes the voltage across the liquid crystal material at a pixel 42 during the frame period when the pixel row, here row 3, is not addressed. A given pixel row is only addressed one time during a frame period, which frame is generally 1/60th of a second or 16.7 milliseconds. For a 480 row AMLCD 10, a given row is only addressed 1/480 of the frame period or about 34.7 microseconds. During the frame time when the pixel row is not addressed the TFT 46 is off. However, the pixel voltage should remain constant over the liquid crystal material. The liquid crystal material has a capacitance $C_{LC}$ and a finite resistance $R_{LC}$. The transistor 46 can have leakage between the driver and source and/or through the liquid crystal material resistance $R_{LC}$. To minimize the voltage drop (data decay) across the liquid crystal material the storage capacitor 50 with capacitance $C_S$ is formed in parallel with $C_{LC}$. The pixel 42 driven by the transistor 46 from Row 3 is coupled to the previous Row 2 by the capacitor 50. This assumes that Row 2 is driven just before Row 3. When the transistor 46 for a given row turns on, the transistor 46 charges $C_{LC}$ and $C_S$ since the total capacitance is equal to $C_{LC}+C_S$. The leakage currents of both the transistor 46 and the liquid crystal material are higher (worse) at higher operating temperatures. The liquid crystal material is contained between the TFT substrate 32 and a color filter or monochrome backplane 94. The backplane 94 is separated by spacers (not illustrated) from the substrate 32.

As previously discussed, the AMLCD 10 can suffer ESD damage during manufacture. Further both row (gate) 34 and column (source) 36 lines as well as the TFT's 46 and 49 can include defects caused by various manufacturing problems, such as debris particles. It would be desirable to provide ESD protection and to test for and repair defects during manufacture of the AMLCD's 10.

Figure 5:
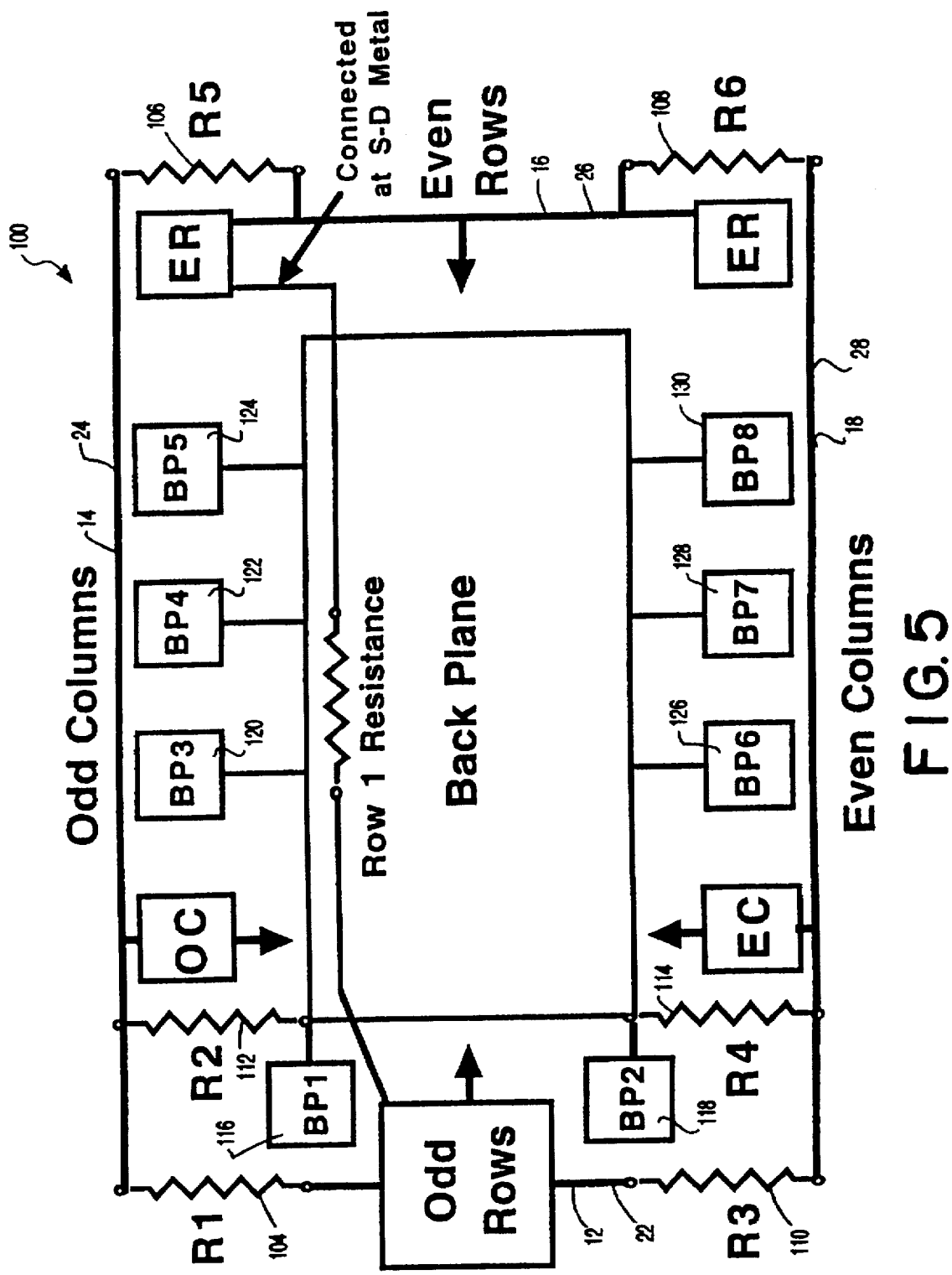
FIG. 5 is a diagrammatic view of the ESD protection and testing technique.

Referring to FIGS. 1 and 5, the ESD protection and testing techniques are best illustrated. An overall schematic 100 of the ESD protection and testing techniques is illustrated in FIG. 5. The outer shorting bars 12, 14, 16, and 18 are connected by the respective inner shorting bars 22, 24, 26 and 28 by a plurality of lines 102 (FIG. 1). The shorting bars are shown as single bars 12, 22; 14, 24; 16, 26 and 18, 28 in FIG. 5.

Although shorting bars have been utilized in prior art display manufacturing, it is not believed that resistive connected shorting bars and inner shorting bars which are not physically removed have previously been utilized. The bars 12, 22; 14, 24; 16, 26 and 18, 28 have a resistance on the order of 15 to 20 ohms. The bars are connected in series by a plurality of resistors 104 (R1), 106 (R5), 108 (R6) and 110 (R3) being a resistance on the order of 100 times the resistance of the bars, for example 2.3 Kohms. The magnitude of the resistors 104, 106, 108 and 110 allow the displays to be tested during the manufacturing steps, while also providing ESD protection since the bars are interconnected to one another and to all the row and column lines 34 and 36.

Since the odd and the even row and column lines 34, 36 are connected together to one of the bars 12, 14, 16 and 18 testing all odd or even row or column lines 34, 36 can be accomplished utilizing a single test point on the respective bars 12, 14, 16 and 18. Also, since the two sets of shorting bars are interconnected, clearly the outer set of shorting bars 12, 14, 16 and 18 can be eliminated to increase packing density of the displays during manufacture. A plurality of AMLCD's typically are manufactured simultaneously on a single substrate. If the outer shorting bars 12, 14, 16 and 18 are eliminated, a contact point preferably would be utilized for test probing.

Referring to FIG. 2, the bars 12, 22; 14, 24; 16, 26 and 18, 28 are formed by depositing them from the metal layer in the overall device structure. The bars 12, 22; 14, 24; 16, 26 and 18, 28 and the resisters 104, 106, 108 and 110 are formed with the gate (row) lines 34 of the two metal layers 54 and 56. Once the gate lines 34 are deposited, they then can be treated for opens or shorts by probing on the bars 12, 22 and 16, 26 to drive the even rows in one polarity and the odd rows in the opposite polarity. One method of testing for opens is to sense the voltages on the lines utilizing an in process tester (IPT). An open in a line or a short between a line can be cured by a laser deposition step or laser cutting of the shorted portion.

Two additional backplane resisters 112 (R2) and 114 (R4) are formed with the resisters 104, 106, 108 and 110, as well as a pair of backplane test pads 116 and 118. These resisters 112 and 114 also can be tested and repaired at this step. The test pads 116 and 118 are connected to the backplane 94 when the AMLCD 10 is completed as illustrated in FIG. 4.

A plurality of backplane drive pads 120, 122, 124, 126, 128 and 130 are deposited with the gate lines 34 and/or with the column lines 36. These pads are then connected to the backplane 94 when the AMLCD 10 is assembled with the backplane.

When the column lines 36 are deposited, the source metal 74 also can be deposited over the shorting bars 12, 22; 14, 24; 16, 26 and 18, 28 to decrease the resistance of the bars. Further, the odd column lines 36 are connected to the inner and outer column shorting bars 14, 24 and the even column lines 36 are connected to the inner and outer column shorting bars 18, 28. The row line 34 can again be tested and the column lines 36 also can be tested as previously described. Further, the row lines 34 and the column lines 36 can be tested for shorts between the rows and columns. Once the TFT's 46 and 49 are completed by clearing the channel 80, the TFT's also can be tested and repaired.

After the final layer 92 has been formed on the substrate 32 and the final testing and repairs have been completed, the outer shorting bars 12, 14, 16 and 18 can be removed along the scribe line 20. The backplane 94 then can be assembled on the substrate 32 and filled with liquid crystal material. ESD protection is still provided by the inner shorting bars 22, 24, 26 and 28, which also are connected to the backplane 94 by the backplane contacts 116 and 118 and the resistors 112 and 114. The complete AMLCD 10 then can be tested with all elements prior to connecting the drive electronics modules to the row pads 38 and the column pads 40.

The drive electronics modules (not illustrated) then can be bonded to the pads 38 and 40, while the inner shorting bars 22, 24, 26 and 28 still are connected. Once the module connections to the pads 38 and 40 have been tested, the bars 22, 24, 26 and 28 are disconnected along the laser line 30 with a laser focused through the glass substrate 32. The ESD protection then is provided by the electronics modules themselves.

What is claimed is:

1. A method of manufacturing active matrix displays, including a plurality of thin film transistors, each transistor coupling a pixel to a row line and a column line in the matrix displays, wherein the improvement comprises the steps of:

forming at least a first set of inner shorting bars adjacent to the display matrix on a first substrate, connecting in parallel a first one of said shorting bars to all the odd row lines, connecting in parallel a second one of said shorting bars to all the even row lines, connecting in parallel a third one of said shorting bars to all the odd column lines and connecting in parallel a fourth one of said shorting bars to all the even column lines; and each said shorting bar having a first resistance and connecting said shorting bars to one another in series by resistors having a magnitude one hundred times greater than the first resistance.

2. The method as defined in claim 1 including forming at least a second set of outer shorting bars adjacent said first set of shorting bars and connecting each one of said second set of shorting bars to a respective one of said first set of shorting bars.

3. The method as defined in claim 1 including forming said first set of shorting bars with said row lines and testing said row lines by driving said even and said odd lines with opposite polarity voltages from said first and second shorting bars.

4. The method as defined in claim 3 including forming said column lines from metal connected to said third and fourth shorting bars and testing said column lines by driving said even and said odd column lines with opposite polarity voltages from said third and fourth shorting bars.

5. The method as defined in claim 4 including depositing said column line metal onto said first set of shorting bars to decrease the resistance of said shorting bars.

6. The method as defined in claim 4 including forming a transistor and a pixel pad for each intersection of column and row lines and testing said transistors and said pixels with said shorting bars.

7. The method as defined in claim 6 including connecting a backplane on a second substrate to said first substrate including a liquid crystal material therebetween and including connecting said backplane to said first set of shorting bars to provide ESD protection.

8. The method as defined in claim 7 including providing display drive electronics and bonding the display drive electronics to said first substrate to connect the drive electronics to the substrate and testing the drive electronics connection.

9. The method as defined in claim 8 including disconnecting said first set of shorting bars from said backplane, said row lines and said column lines after said drive electronics connection is tested.

10. The method as defined in claim 9 including testing said first set of shorting bars to ensure that the bars are disconnected.

11. The method as defined in claim 9 including disconnecting said shorting bars from said row lines and said column lines by utilizing a laser to open the connections between said shorting bar and said row lines and said column lines.

12. The method as defined in claim 11 including disconnecting said shorting bars from one another.

13. The method as defined in claim 1 including forming each shorting bar of said first set of shorting bars having a resistance on the order of 20 ohms and forming said resistors having a resistance of at least 2000 ohms.

14. A display backplane for active matrix displays, including a plurality of thin film transistors, each transistor coupling a pixel to a row line and a column line in the matrix displays, wherein the improvement comprises:

at least a first set of inner shorting bars formed adjacent to the display matrix on a first substrate, a first one of said shorting bars connected in parallel to all the odd row lines, a second one of said shorting bars connected in parallel to all the even row lines, a third one of said shorting bars connected in parallel to all the odd column lines and a fourth one of said shorting bars connected in parallel to all the even column lines; and each said shorting bar having a first resistance and said shorting bars connected to one another in series by resistors having a magnitude one hundred times greater than the first resistance.

15. The improvement as defined in claim 14 including at least a second set of outer shorting bars formed adjacent said first set of shorting bars with each one of said second set of shorting bars connected to a respective one of said first set of shorting bars.

16. The improvement as defined in claim 14 including each shorting bar of said first set of shorting bars having a resistance on the order of 20 ohms and said resistors having a resistance of at least 2000 ohms.

* * * * *